(12) United States Patent
Derat et al.

(10) Patent No.: US 11,680,971 B2
(45) Date of Patent: Jun. 20, 2023

(54) METHOD OF PERFORMING A MEASUREMENT OF A DEVICE UNDER TEST

(71) Applicant: Rohde & Schwarz GmbH & Co. KG, Munich (DE)

(72) Inventors: Benoit Derat, Munich (DE); Adam Tankielun, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 187 days.

(21) Appl. No.: 17/226,900

(22) Filed: Apr. 9, 2021

(65) Prior Publication Data

US 2021/0356503 A1    Nov. 18, 2021

(30) Foreign Application Priority Data

May 13, 2020   (EP) .................................... 20174513

(51) Int. Cl.
   *G01R 31/302*    (2006.01)
   *G01R 29/08*    (2006.01)
   *H04B 17/12*    (2015.01)

(52) U.S. Cl.
   CPC ......... *G01R 29/0878* (2013.01); *H04B 17/12* (2015.01)

(58) Field of Classification Search
   CPC .. G01R 29/10; G01R 29/105; G01R 29/0814; G01R 29/0821; G01R 29/0878;

(Continued)

(56) References Cited

U.S. PATENT DOCUMENTS 11,251,840 B1 *   2/2022 Wen ...................... H04B 7/043
2019/0391196 A1 * 12/2019 Rowell .................... H01Q 3/34

(Continued)

FOREIGN PATENT DOCUMENTS

EP   3376240 A1   9/2018
EP   3584590 A1   12/2019

*Primary Examiner* — Thang X Le
(74) *Attorney, Agent, or Firm* — Christensen O'Connor Johnson Kindness LLC

(57) ABSTRACT

A method of performing a measurement of a device under test by using an antenna array. The method includes: providing an antenna array that includes several antenna elements; providing a device under test configured to communicate over-the-air; locating the device under test at a first test location, thereby establishing a first relative distance between the device under test and the antenna array; performing a first measurement over-the-air when the first relative distance is provided between the device under test and the antenna array, thereby obtaining first measurement results; moving the antenna array and/or the device under test, thereby establishing a second relative distance between the device under test and the antenna array; and performing a second measurement over-the-air when the second relative distance is provided between the device under test and the antenna array, thereby obtaining second measurement results, wherein a quiet zone is established, in which the device under test is located, and wherein the size of the quiet zone is derived from a combination of at least two transfer functions associated with the first measurement results and the second measurement results. Further, a measurement system is described.

18 Claims, 2 Drawing Sheets

(58) Field of Classification Search
CPC ............ G01R 29/0892; G01R 29/0871; G01R 31/001; G01R 1/0018; H04B 17/12; H04B 17/29
See application file for complete search history.

(56) References Cited

U.S. PATENT DOCUMENTS

| | | | |
|---|---|---|---|
| 2020/0266904 A1* | 8/2020 | Abadie | ................ G01R 29/105 |
| 2020/0271709 A1* | 8/2020 | Derat | ................ G01R 29/0871 |
| 2021/0148959 A1* | 5/2021 | Rowell | ................ G01R 29/105 |
| 2021/0302484 A1* | 9/2021 | Rowell | ............... G01R 29/0892 |

* cited by examiner

METHOD OF PERFORMING A MEASUREMENT OF A DEVICE UNDER TEST

FIELD OF THE DISCLOSURE

Embodiments of the present disclosure generally relate to a method of performing a measurement of a device under test by using an antenna array.

BACKGROUND

In the state of the art, measurement systems and methods are known that use algorithms to transform the results of Near Field (NF) antenna measurements performed into Far Field (FF) representatives. These algorithms are also called NF/FF algorithms due to the respective transformation done.

Moreover, the concept of plane-wave synthesis is known that uses an antenna array with several antenna elements controlled individually such that their respective signals superimpose to plane waves (far-field conditions) in the near field, namely in near distance. Those antenna arrays are also called plane wave converters (PWC). Accordingly, the respective weights of antenna excitations, for example amplitude and phase coefficients, have to be optimized in order to ensure plane waves in the near field.

Furthermore, a uniform quiet zone is required in order to obtain accurate measurement results. This can be achieved by increasing the density of the antenna elements provided by the antenna array while simultaneously optimizing the respective weights of the antenna excitations. This is especially important when the frequency of the signals used for testing purposes increases since the spacing between the individual antenna elements is ideally a fraction of the respective wavelength used, preferably below half of the wavelength. Since modern communication devices use telecommunication standards with higher frequencies, this becomes more important nowadays.

Moreover, an antenna array comprising a large number of antenna elements also helps to increase the size of the respective quiet zone. This in turn simplifies the testing of large devices under test since they need an appropriately sized quiet zone.

However, the number of antenna elements within the antenna array cannot be increased in an unlimited manner since this would increase the costs of the antenna array and the complexity of the overall setup, resulting in impractical measurement systems.

SUMMARY

Accordingly, there is a need for a method of performing a measurement of a device under test that ensures accurate measurement results in a cost-efficient manner Embodiments of the present disclosure provide a method of performing a measurement of a device under test by using an antenna array. In an embodiment, the method comprises the steps of:

providing an antenna array that comprises several antenna elements;

providing a device under test configured to communicate over-the-air (OTA);

locating the device under test at a first test location, thereby establishing a first relative distance between the device under test and the antenna array;

performing a first measurement over-the-air when the first relative distance is provided between the device under test and the antenna array, thereby obtaining first measurement results;

moving the antenna array and/or the device under test, thereby establishing a second relative distance between the device under test and the antenna array which is for example different to the first relative distance; and performing a second measurement over-the-air when the second relative distance is provided between the device under test and the antenna array, thereby obtaining second measurement results, wherein a quiet zone is established, in which the device under test is located, and wherein the size of the quiet zone is derived from a combination of at least two transfer functions associated with the first measurement results and the second measurement results.

Further, embodiments of the present disclosure provide a measurement system for performing a measurement of a device under test. In an embodiment, the measurement system comprises an antenna array with several antenna elements and the device under test configured to communicate over-the-air. The antenna array and/or the device under test are moveable with respect to each other such that the measurement system provides at least two different test setups which correspond to different relative distances between the device under test and the antenna array. The measurement system is configured to perform measurements at the different test setups in order to obtain respective measurement results. The measurement system is further configured to establish a quiet zone, in which the device under test is located. The size of the quiet zone is derived from a combination of at least two transfer functions associated with the respective measurement results obtained at the different test setups of the measurement system.

Accordingly, the accuracy of the measurement and/or the size of the quiet zone can be increased even though the costs and complexity of the measurement system, for example the antenna array, are not increased. The relative distance between the antenna array and the device under test is adapted during the at least two different measurements performed wherein the respective measurement results obtained during the different measurements, namely at the different test setups, are combined with each other in order to obtain a single quiet zone. Accordingly, the size of the quiet zone can be enlarged and/or the measurement accuracy is improved.

The main idea corresponds to combining the measurement results obtained at the at least two different relative positions, namely the relative locations and/or orientations, of the antenna array and the device under test with respect to each other in order to achieve a single (virtual) quiet zone from the at least two different measurement results measured physically. In other words, the at least two transfer functions between the device under test and the antenna array, which mathematically describe the signal transmission in the respective test setup, are combined with each other in order to achieve the (mathematically combined) quiet zone from the respective measurement results. Hence, the mathematically combined quiet zone corresponds to a virtual quiet zone.

In contrast thereto, it is known in the state of the art to increase a sampling rate by performing a respective measurement with a multi-probe system instead of a single-probe system that would be moved around the device under test. However, the object of these techniques is to increase the sampling rate of the measurement system rather than improving a respective quiet zone provided for testing purposes. Consequently, the techniques known in the state of the art do not combine the respective measurement results obtained mathematically in order to achieve the (virtual) quiet zone, namely the mathematically combined quiet zone.

Some embodiments of the present disclosure concerns the usage of several, for example all, antenna elements of the antenna array such that these antenna elements (probes) together are used as a single probe. Further, the antenna array has two different relative positions with regard to the device under test due to the relative movement between the at least two different test setups, resulting in measurement results obtained at the two different relative positions. The waves associated with the measurement results are virtually or rather mathematically combined, namely via the respective transfer functions, such that these waves (virtually) interfere with each other, resulting in the plane waves which define the quiet zone.

In other words, waves associated with the different test setups are mathematically described by the respective transfer function which is associated with the respective measurement results. These transfer functions are combined with each other, yielding a (virtual) interference of the respective waves that is mathematically expressed by the combination of the transfer functions, thereby obtaining the virtual quiet zone as a result of the mathematical combination of the transfer functions.

Generally, the antenna array may correspond to a plane wave converter that is configured to provide far-field conditions (plane waves) at the location of the device under test even though the device under test and the antenna array are distanced from each other by a distance lower than the Fraunhofer distance.

An aspect provides that the combination of the at least two transfer functions is made from target fields provided at the first and second relative distances, wherein the target fields together combine as a plane wave. Generally, a respective target field (distribution) is obtained by controlling the antenna elements of the antenna array appropriately. In some embodiments, the respective weights of antenna excitations, for example amplitude and phase coefficients, are controlled in order to obtain the respective target field. For each relative distance, a respective target field is generated in the target quiet zone. The respective target fields generated are designed such that their combination yields a wavefront as close as possible to a plane-wave within the target quiet zone. Accordingly, it is not necessary that the individual target fields used at the first test setup or the second test setup already have to provide planar waves by themselves. In some embodiments, it is sufficient that their combination provides the far-field characteristics at the quiet zone.

The antenna array and/or the device under test are/is moved with respect to each other such that the size of the quiet zone is increased virtually. The size of the quiet zone is increased virtually since two different target fields are provided at the different relative distances which are combined with each other in order to obtain the quiet zone with the increased size. Therefore, the increased size of the quiet zone is a virtual one since the respective size is obtained by mathematically combining the respective measurement results obtained from the at least two different test setups. The virtual increase of the size of the quiet zone corresponds to a virtual extension of the antenna array size.

According to another aspect, an individual quiet zone is established during each of the respective relative distances between the device under test and the antenna array. The individual quiet zone is associated with the individual target field. The respective size of the individual quiet zone may be different to the size of the (virtual) quiet zone that has been obtained by mathematically combining the respective transfer functions. In other words, the (virtual) quiet zone is obtained by combining the at least two individual quiet zones provided at the respective test setups, namely when establishing the at least two different relative distances between the device under test and the antenna array.

In some embodiments, an adaption of at least one of the individual quiet zones is done so that a large homogenous quiet zone is provided. For instance, the adaption of the at least one individual quiet zone is performed at the respective edges of the individual quiet zone. Therefore, the individual quiet zones provided at the different test setups can be combined easily such that an overall quiet zone, namely a virtual one, is provided that has a larger size while being homogeneous.

Further, the antenna array and/or the device under test may be moved with respect to each other such that the number of antenna elements of the antenna array is increased virtually. Put differently, the density of the antenna elements of the antenna array is increased by moving the physical antenna array and/or the physical device under test in a certain way. The virtual increase of the density of the antenna elements is achieved by combining the respective target fields provided at the different relative positions, namely the associated transfer functions.

The accuracy of the measurement may be increased by moving the antenna array and/or the device under test with respect to each other. Since the respective relative movement may yield the virtually increased number of antenna elements, the respective density of antenna elements of the antenna array is increased which in turn results in a higher accuracy of the measurement due to the (virtually) increased number of antenna elements.

Again, the virtual increase of the number of antenna elements is achieved due to combining the measurement results obtained at the two different test setups associated with the different relative distances between the antenna array and the device under test. This clearly indicates that the measurement results obtained at the at least two different test setups are used together, namely mathematically combined, in order to obtain a single output that is associated with the (virtually) increased number of antenna elements or rather the (virtually) enlarged density of the antenna elements.

In some embodiments, the second relative distance between the device under test and the antenna array corresponds to a complementary position with respect to the first relative distance. The structure and/or the arrangement of the respective antenna elements of the antenna array are/is taken in consideration when moving the antenna array and/or the device under test with respect to each other, thereby increasing the density of the antenna elements. In some embodiments, the distance of the antenna elements among each other has to be taken into account in order to obtain the increased density of the antenna elements.

In some embodiments, the antenna array and/or the device under test are/is displaced transversely along an x-axis and/or a y-axis. For instance, an antenna array is defined by a major plane spanned along the x- and y-axes. Hence, the antenna array may correspond to a two-dimensional antenna array such that all antenna elements of the antenna array are located in a plane, namely the major plane of the antenna array.

However, the antenna array may also correspond to a three-dimensional antenna array that comprises antenna elements being arranged in a three-dimensional structure.

Nevertheless, the antenna array has a major plane that is spanned along the axes used for transversely displacing the antenna array and/or the device under test with respect to each other. In some embodiments, the antenna elements of a three-dimensional antenna array are displaced in z-direction only minimally compared to the dimensions of the antenna array.

The antenna array and/or the device under test may be displaced transversally by half the distance between neighbored antenna elements of the antenna array. This ensures that the measurement results obtained at the at least two different test setups can be combined with each other easily. Moreover, the distribution of the antenna elements, namely the virtually increased distribution of the antenna elements, is homogeneous.

Another aspect provides that a plane wave synthesis is performed such that far-field conditions are provided even though the respective relative distance is lower than the Fraunhofer distance. The Fraunhofer distance corresponds to the distance that distinguishes far-field conditions from near-field conditions. As mentioned above, the individual target fields may not provide far-field conditions, but their combination does.

For instance, signals associated with the antenna elements are weighted, for example differently. The respective signals at the antenna elements may be weighted differently, for instance by amplitude and phase coefficients, such that the far-field conditions are obtained; at least in combination. In some embodiments, the antenna excitations are weighted appropriately, thereby obtaining the respective target fields.

According to another aspect, the antenna array and/or the device under test are/is moved, thereby establishing a third relative distance between the device under test and the antenna array, wherein a third measurement over-the-air is performed when the third relative distance is provided between the device under test and the antenna array, thereby obtaining third measurement results. Accordingly more than two different test setups, more than two different measurement results or rather more than two different target fields may be provided and combined with each other mathematically in order to achieve the respective combined target field, namely the (virtual) quiet zone. In some embodiments, more than two different test setups are used to increase the size of the quiet zone appropriately.

For instance, the device under test is set in a transmission mode. Thus, the respective measurements relate to characterizing the over-the-air (OTA) properties of the device under test.

In general, examples of the measurement system are configured to perform examples of the methods described above.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
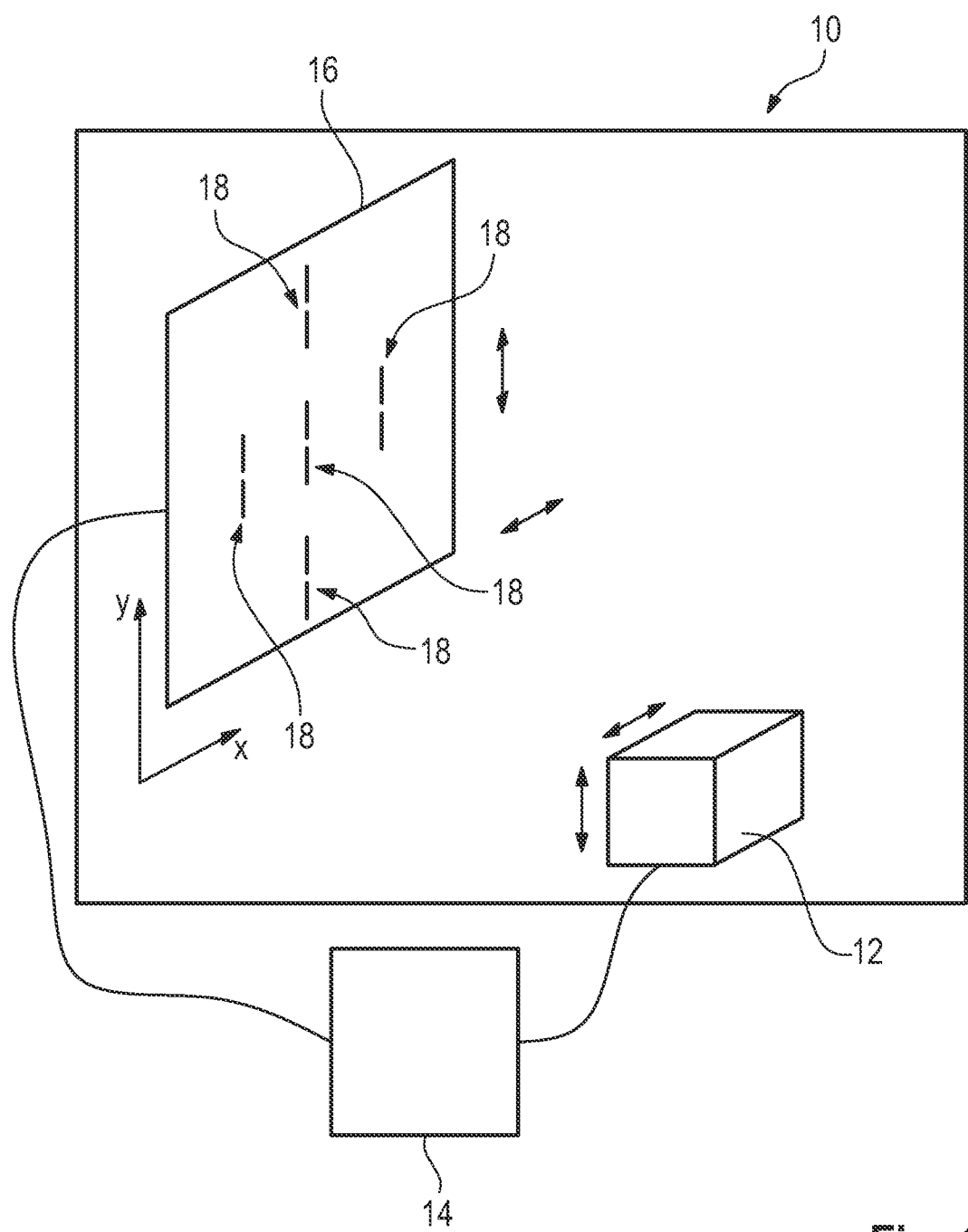
FIG. 1 schematically shows a measurement system according to an embodiment of the present disclosure.

In FIG. 1, a measurement system 10 is shown that is used for performing over-the-air measurements. The measurement system 10 comprises a chamber 11, for instance an anechoic or shielded chamber, in which a device under test 12 is located for testing purposes. The measurement system 10 also comprises a measurement equipment 14 that is connected with an antenna array 16 in a signal transmitting manner which is located in the chamber 11 as well.

The antenna array 16 comprises several antenna elements 18 that are located in a plane spanned by an x-axis and a y-axis. The respective plane corresponds to a major plane of the antenna array 16.

The device under test 12 may correspond to a communication device that is generally configured to communicate with other entities over-the-air. For instance, the device under test 12 may relate to a user equipment such as a mobile phone, a tablet or any other communication device. However, the device under test 12 may also relate to a base station.

As shown in FIG. 1, the antenna array 16 is connected with the measurement equipment 14 such that signals received by the antenna array 16, for example its antenna elements 18, are forwarded to the measurement equipment 14 for analyzing purposes. In some embodiments, the measurement equipment 14 may comprise a signal generator that is configured to generate a signal to be transmitted by the antenna array 16, for example its antenna elements 18, which are received by the device under test 12. In some embodiments, the measurement equipment 14 includes circuitry configured to carry out the functionality described herein.

The device under test 12 may also comprise a connection with the measurement equipment 14. For instance, the device under test 12 receives control signals from the measurement equipment 14. Moreover, the device under test 12 may also forward signals received to the measurement equipment 14 for evaluation purposes.

The device under test 12 and the antenna array 16 are located with respect to each other such that a first relative distance between the device under test 12 and the antenna array 16 is established. Hence, the device under test 12 is located at a first test location in which the first relative distance between the device under test 12 and the antenna array 16 is ensured.

This respective setup corresponds to a first test setup, in which a first measurement can be performed over-the-air in order to obtain first measurement results. These measurement results are associated with a first target field (distribution) that is obtained by controlling the antenna elements 18 of the antenna array 16 appropriately.

For instance, respective weights of antenna excitations, for example amplitude and phase coefficients, are controlled in order to obtain the respective target field.

Generally, the antenna array 16 and/or the device under test 12 can be moved with respect to each other as indicated by the arrows in FIG. 1 such that another relative distance between the device under test 12 and the antenna array 16 can be reached. Then, another measurement can be performed, thereby obtaining further measurement results. In some embodiments, the antenna array 16 and/or the device under test 12 can be move by one or more motorized linear stages. In some embodiments, the one or more motorized linear stages are configured to receive suitable control signals and move the antenna array 16 and/or the device under test 12 to the commanded position. In other embodiments, the antenna array 16 and/or the device under test 12 can be manually moved to the desired location.

This will be explained hereinafter in more detail while also referring to FIGS. 2 and 3.

Figure 2:
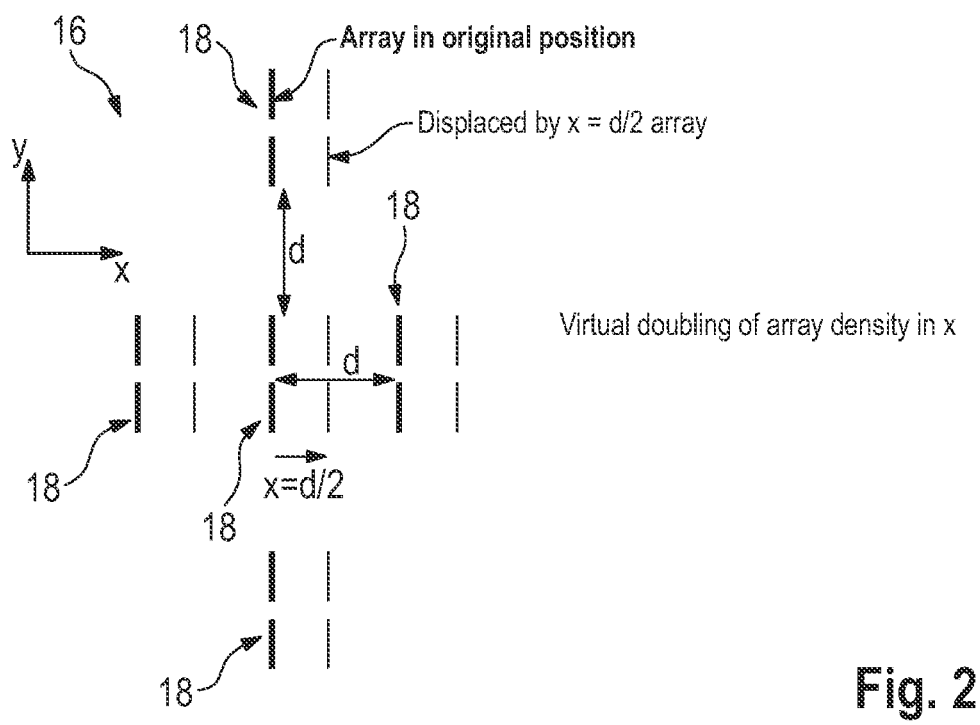
FIG. 2 shows a schematic overview illustrating a method of performing a measurement of the device under test according to a first embodiment of the present disclosure.
Figure 3:
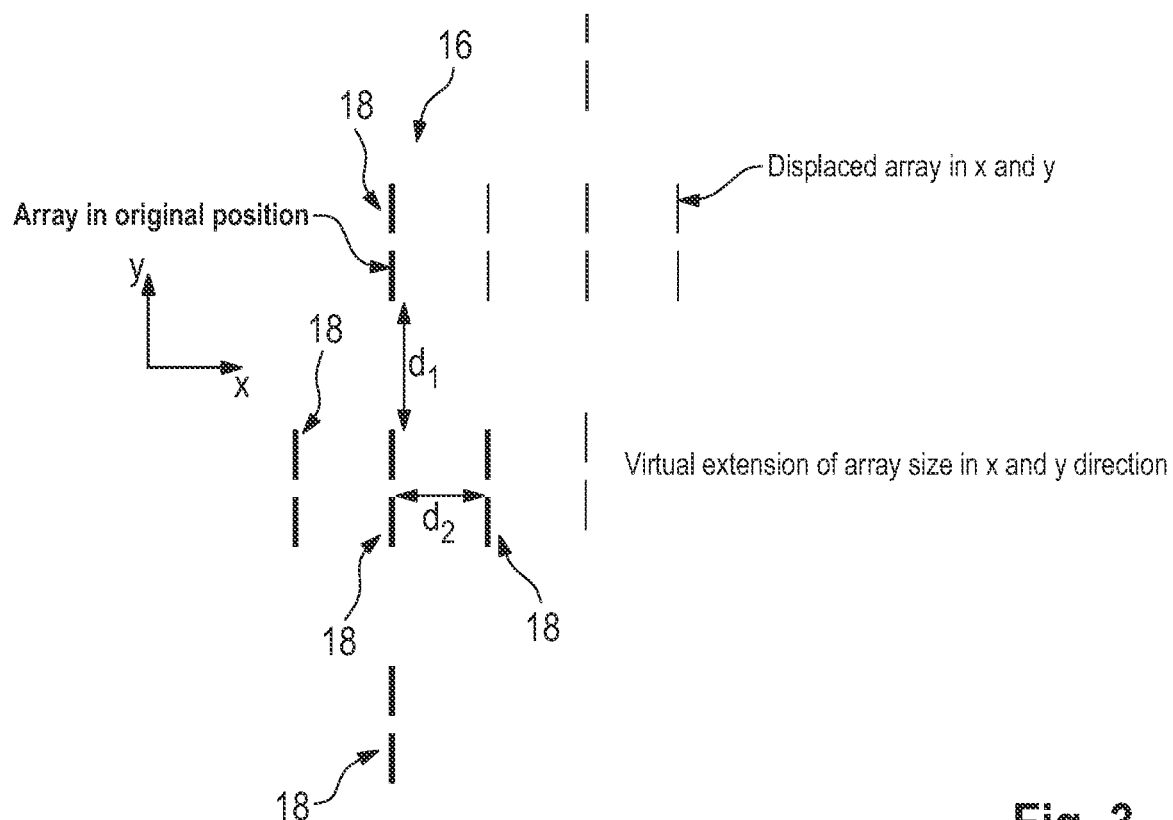
FIG. 3 shows an overview illustrating a method of performing a measurement of the device under test according to a second embodiment of the present disclosure.

In the first test setup illustrated by the bold lines in FIGS. 2 and 3, a first individual quiet zone is established. As shown in FIG. 2, either the device under test 12 or the antenna array 16 is displaced transversely along one of the axes, namely the x-axis or the y-axis in order to arrive at a second test setup illustrated by the light lines in FIGS. 2 and 3.

In some embodiments, the antenna elements 18 of the antenna array 16 are displaced with respect to the device under test 12 along the x-axis. In some embodiments, the antenna elements 18 of the antenna array 16 are displaced with respect to the device under test 12 along the y-axis. In some embodiments, the antenna elements 18 of the antenna array 16 are displaced with respect to the device under test 12 along both the x-axis and the y-axis. It will be appreciated that the respective displacement may be a result of movement of the antenna array 16 solely, a movement of the device under test 12 solely, or a combined movement of the antenna array 16 and the device under test 12.

In the specific embodiment shown in FIG. 2, the second setup differs from the first setup in that a relative displacement along the x-axis occurred, wherein the relative displacement x corresponds to half the distance d between neighbored antenna elements 18 of the antenna array 16, namely x=d/2 as indicated in FIG. 2.

In some embodiments, the second relative distance between the device under test 12 and the antenna array 16 may correspond to a complementary position with respect to the first relative distance. The relative movement takes the structure of the antenna array 16 into account, for example the arrangement of the individual antenna elements 18 such as the distance between them. As mentioned above, the respective transversal displacement may correspond to half of the distance between neighbored antenna elements 18.

In this second test setup, a second measurement is performed over-the-air in order to obtain second measurement results. The second test setup corresponds to another individual quiet zone that is associated with a respective target field of the antenna array 16 in the second test setup.

The respective measurement results obtained in the at least two test setups, for example the transfer functions associated with the measurement results, are combined with each other mathematically such that a virtually increased density of antenna elements 18 is provided.

In other words, the array density of the antenna array 16 is virtually doubled in the x-direction due to the relative transverse displacement between the antenna array 16 and the device under test 12 in the x-direction, yielding the respective transfer functions for the at least two test setups.

These at least two transfer functions are combined with each other in a mathematical manner, resulting in the virtually increased density of the antenna array 16.

Due to the higher density of the antenna elements 18, the accuracy of the measurement can be increased, namely by moving the antenna array 16 and/or the device under test 12 with respect to each other.

As mentioned above, this is achieved since the respective measurement results obtained at the different test setups are combined with each other, for example the transfer functions associated with the measurement results. Hence, the different measurement results are not used for evaluating the characteristics of the device under test 12 at different positions, but to combine the individual target fields of the antenna array 16 associated with the respective test setup.

In other words, the size of the respective quiet zone is derived from a combination of the at least two transfer functions associated with the respective measurement results obtained at the different test setups.

The at least two transfer functions are associated with the target fields provided at the respective test setups. The individual target fields together combine as plane waves, resulting in the quiet zone. However, the individual target field at the first test setup or rather the second test setup does not necessarily have to provide planar waves.

Generally, each target field may correspond to an individual quiet zone, yielding at least two different individual quiet zones that obtained are combined with each other in order to obtain the quiet zone.

By combining the individual quiet zones, an adaption of at least one of the individual quiet zones may be performed so that a large homogeneous quiet zone can be provided. The adaption typically applies to the edges of the individual quiet zone in order to reduce any boundary effects.

Accordingly, FIG. 2 shows a relative movement of the antenna array 16 and the device under test 12 in order to increase the size of the quiet zone. In some embodiments, the relative displacement creates a virtually x-times larger antenna array 16 in defined dimensions due to the combination of successive measurements at various relative positions, namely the different test setups.

For each of the relative positions, the target field in the quiet zone may not be a plane-wave. However, the coefficients of the antenna array 16, namely the antenna excitations, are then optimized for each relative position such that the combination of the individual target fields generated by the antenna array 16 in the respective test setup is as close as possible to plane-wave in the target quiet zone.

In FIG. 3, an alternative embodiment is shown that illustrates that a relative movement between the antenna array 16 and the device under test 12 was performed in the x-direction and the y-direction. Therefore, the size of the antenna array 16 is virtually extended in both directions, yielding a larger size of the quiet zone. The respective movement in both directions may be performed between a first test setup and a second test setup such that the relative movement between the two test setups corresponds to a movement in two different directions.

Alternatively, the relative movement may correspond to three different test setups such that the second test setup relates to a movement in a first direction, for instance the x-direction or the y-direction, whereas the third test setup corresponds to a movement in the other of both directions starting from the second test setup. Accordingly, the antenna array 16 and/or the device under test 12 may be moved several times, thereby establishing more than two different relative distances between them. After each movement, a respective test setup may be reached at which a corresponding measurement is performed in order to obtain measurement results that are associated with a respective individual target field for the relative position or rather the respective test setup.

Accordingly, at least two different measurements at two different relative distances between the antenna array 16 and the device under test 12 are performed which are combined with each other mathematically in order to increase the number of antenna elements 18 of the antenna array 16 virtually and/or to increase the size of the quiet zone.

In the embodiment of FIG. 3, d1 is the spacing between antenna elements 18 in the y-direction and d2 is the spacing between antenna elements 18 in the x-direction. As shown in FIG. 3, the second test setup corresponds to a relative movement of d1 in y-direction and 2*d2 in x-direction compared to the original position, namely the first test setup.

The relative movement may be established by a single relative movement, resulting only in two different test setups or rather several different test setups, namely a first one that corresponds to the original one, a second one that corresponds to a relative displacement in the x-direction or the y-direction and a third one that corresponds to a relative displacement in the remaining direction.

According to another example, if d is the spacing between neighbored antenna elements 18 in a 2-D antenna array 16, by considering a linear combination of three measurements, one with the antenna array 16 in the original position, and two respectively with a displacement of d/2 in the x-direction and a displacement of d/2 in the y-direction, a quiet zone can be created which would be equivalent to that created by a 2-D antenna array 16 with a double density of antenna elements 18 or rather probes.

Generally, this is achieved in both scenarios by combining the respective transfer functions associated with the individual target fields at the different test setups.

In addition, the respective individual target fields are combined with each other such that far-field conditions are obtained in total even though the individual target fields do not provide far-field conditions.

As already mentioned above, the mathematical combination of the transfer functions associated with the individual target fields results in a virtual quiet zone with increased size or rather an antenna array 17 with increased density of antenna elements 18.

In any case, the measurements to be performed by the measurement system 10 can be improved since larger devices under test 12 can be tested by the measurement system 10 and/or a higher accuracy is ensured.

Accordingly, an increase in measurement accuracy or in size of the quiet zone is enabled for a limited increase in cost and complexity of the antenna array 16, namely the planewave synthesis array.

Certain embodiments disclosed herein may utilize circuitry (e.g., one or more circuits) in order to implement standards, protocols, methodologies or technologies disclosed herein, operably couple two or more components, generate information, process information, analyze information, generate signals, measure signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about", "approximately", "near" etc., mean plus or minus 5% of the stated value.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of performing a measurement of a device under test by using an antenna array, the method comprising:
   providing an antenna array that comprises several antenna elements;
   providing a device under test configured to communicate over-the-air;
   locating the device under test at a first test location, thereby establishing a first relative distance between the device under test and the antenna array;
   performing a first measurement over-the-air when the first relative distance is provided between the device under test and the antenna array, thereby obtaining first measurement results;
   moving at least one of the antenna array and the device under test, thereby establishing a second relative distance between the device under test and the antenna array; and
   performing a second measurement over-the-air when the second relative distance is provided between the device under test and the antenna array, thereby obtaining second measurement results,
   wherein a quiet zone is established, in which the device under test is located, and wherein the size of the quiet zone is derived from a combination of at least two transfer functions associated with the first measurement results and the second measurement results.

2. The method according to claim 1, wherein the combination of the at least two transfer functions is made from target fields provided at the first and second relative distances, and wherein the target fields together combine as a plane wave.

3. The method according to claim 1, wherein at least one of the antenna array and the device under test is moved with respect to each other such that the size of the quiet zone is increased virtually.

4. The method according to claim 1, wherein an individual quiet zone is established during each of the respective relative distance between the device under test and the antenna array.

5. The method according to claim 4, wherein an adaption of at least one of the individual quiet zones is done so that a large homogenous quiet zone is provided.

6. The method according to claim 5, wherein the adaption of the at least one individual quiet zone is performed at respective edges of the individual quiet zone.

7. The method according to claim 1, wherein at least one of the antenna array and the device under test is moved with respect to each other such that the number of antenna elements of the antenna array is increased virtually.

8. The method according to claim 1, wherein the accuracy of the measurement is increased by moving at least one of the antenna array and the device under test with respect to each other.

9. The method according to claim 1, wherein the second relative distance between the device under test and the antenna array corresponds to a complementary position with respect to the first relative distance.

10. The method according to claim 1, wherein at least one of the antenna array and the device under test is displaced transversally along at least one of an x-axis or a y-axis.

11. The method according to claim 10, wherein the antenna array is defined by a major plane spanned along the x- and y-axes.

12. The method according to claim 10, wherein at least one of the antenna array and the device under test is displaced transversally by half the distance between neighbored antenna elements of the antenna array.

13. The method according to claim 1, wherein a plane wave synthesis is performed such that far-field conditions are provided even though the respective relative distance is lower than the Fraunhofer distance.

14. The method according to claim 1, wherein signals associated with the antenna elements are weighted.

15. The method according to claim 1, wherein signals associated with the antenna elements are weighted differently.

16. The method according to claim 1, wherein at least one of the antenna array and the device under test is moved, thereby establishing a third relative distance between the device under test and the antenna array, and wherein a third measurement over-the-air is performed when the third relative distance is provided between the device under test and the antenna array, thereby obtaining third measurement results.

17. The method according to claim 1, wherein the device under test is set in a transmission mode.

18. A measurement system for performing a measurement of a device under test, comprising:
an antenna array with several antenna elements and the device under test configured to communicate over-the-air, wherein at least one of the antenna array or the device under test is movable with respect to each other such that the measurement system provides at least two different test setups which correspond to different relative distances between the device under test and the antenna array, wherein the measurement system is configured to perform measurements at the different test setups in order to obtain respective measurement results, wherein the measurement system is configured to establish a quiet zone, in which the device under test is located, and wherein the size of the quiet zone is derived from a combination of at least two transfer functions associated with the respective measurement results obtained at the different test setups of the measurement system.

* * * * *